United States Patent
Hio (10) Patent No.: US 6,267,618 B1
(45) Date of Patent: Jul. 31, 2001

(54) TERMINAL FITTING FOR FLAT CONDUCTOR

(75) Inventor: Masahide Hio, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/703,966

(22) Filed: Nov. 1, 2000

(51) Int. Cl.[7] ....................................................... H01R 4/24
(52) U.S. Cl. ........................... 439/422; 439/397; 439/424
(58) Field of Search ..................................... 439/422, 423, 439/424, 425, 397, 393, 401, 402, 403, 404, 405, 399

(56) References Cited

U.S. PATENT DOCUMENTS

| | | | |
|---|---|---|---|
| 3,247,316 | * 4/1966 | Weimer, Jr. | 174/94 R |
| 4,040,702 | 8/1977 | McKee et al. | 439/399 |
| 4,082,402 | 4/1978 | Kinkaid et al. | 439/422 |
| 4,560,224 | * 12/1985 | Weisenburger | 439/422 |
| 4,832,620 | * 5/1989 | Yamamoto | 439/422 |
| 5,137,468 | * 8/1992 | Murakami | 439/422 |
| 6,146,185 | * 11/2000 | Cole et al. | 439/399 |

FOREIGN PATENT DOCUMENTS

| | | |
|---|---|---|
| 63-73861 | 5/1988 | (JP) . |
| 63-73862 | 5/1988 | (JP) . |

* cited by examiner

*Primary Examiner*—Tulsidas Patel
(74) *Attorney, Agent, or Firm*—Anthony J. Casella; Gerald E. Hespos (57) ABSTRACT

A terminal fitting (20) has a base plate (22) and a pressing plate (30) confronting the base plate (22). A side wall (23) is formed on one side edge of the base plate (22). A contact blade (25A) is projected on an upper edge (23A) of the side wall (23) such that the contact blade (25A) is widthwise flush with the side wall (23). A contact blade (25B) is erected on the other side edge of the base plate (22) such that the contact blade (25A) and the contact blade (25B) have the same height. On the bottom portion of the base plate (22), a raised part (27) is formed for a disposing position of each contact blade (25A) by folding the other side edge of the base plate (22). The height of the upper surface of the raised part (27) is a little larger than that of the upper edge (23A) of the side wall (23). Before the FFC (10) is caught by the upper edge (23A) of the side wall (23) of the base plate 22, the contact blades (25A) and (25B) are pierced into the conductive path (11), with the FFC (10) being sandwiched between the raised part (27) and the pressing plate (30). It is possible to avoid generation of a flank between the base plate (22) and the pressing plate (30) and thus prevent the FFC (10) from escaping thereto. Thus, it is possible to allow a cut surface (11A) of the conductive path (11) to confront the surfaces of the contact blades (25A) and (25B) properly and obtain a preferable contact state.

9 Claims, 9 Drawing Sheets

TERMINAL FITTING FOR FLAT CONDUCTOR

BACKGROUND OF THE INVENTION

1. Field of the Invention

The present invention relates to a terminal fitting for connection to a flat conductor.

2. Description of the Related Art

Prior art flat conductors include an FFC (flexible flat cable) and an FPC (flexible print circuit board). The prior art FFC includes a plurality of parallel conductive paths sandwiched between insulation sheets, such that the FFC resembles a flexible ribbon. Terminal fittings are connected to the respective conductive paths of the FFC by embedding the conductive paths in the insulation sheet or by tearing off the insulation sheet on a section of the FFC to expose sections of the conductive paths on one surface of the FFC.

Figure 7:
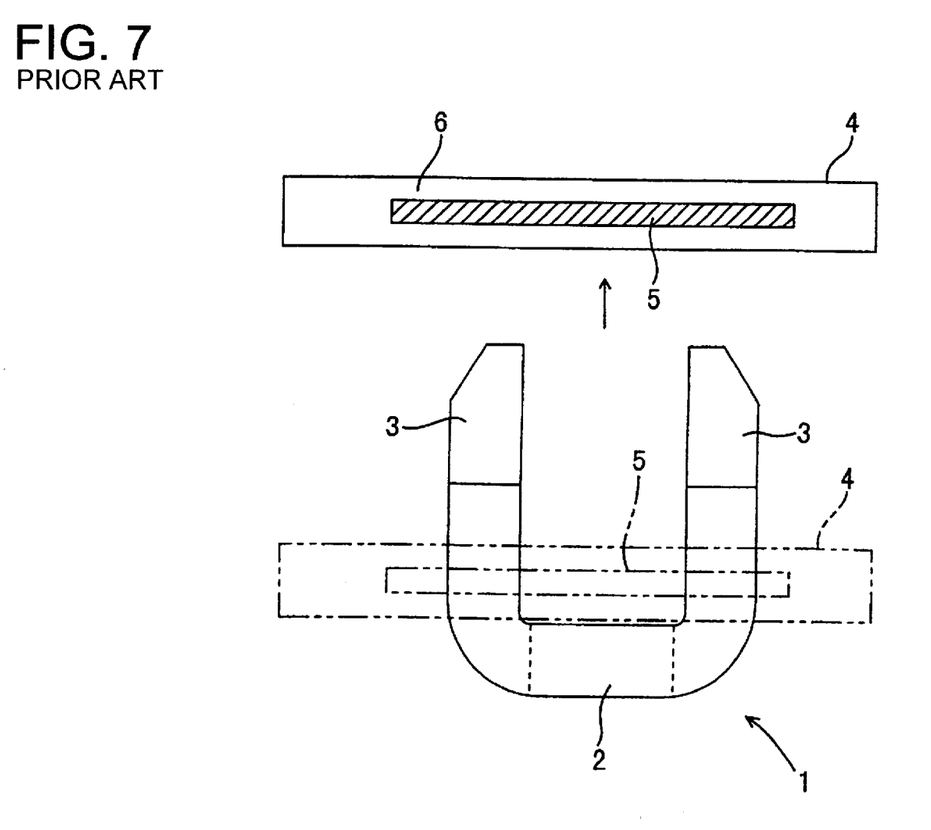
FIG. 7 is a sectional view showing a conventional connection mode.

The former method is called a through type method, and has an advantage of omitting the stage of tearing off the insulation sheet. This method is disclosed in Japanese Patent Application Laid-Open No. 50-100585, and is shown in FIG. 7. In this method, contact blades 3 are erected on both side edges of a base plate 2 of a terminal fitting 1. Both contact blades 3 pierce a conductive path 5 of an FFC 4 to bring cut end surfaces of the conductive path 5 into the contact blade 3.

However, in this method, there is a fear that when the contact blade 3 is pierced into the conductive path 5, the FFC 4 floats between the contact blades 3 and thus the cut end surfaces of the conductive path 4 do not contact the contact blade 3 favorably. To avoid the unfavorable contact, it is conceivable to press the FFC 4 when the contact blade 3 is pierced into the conductive path 5.

Figure 8A:
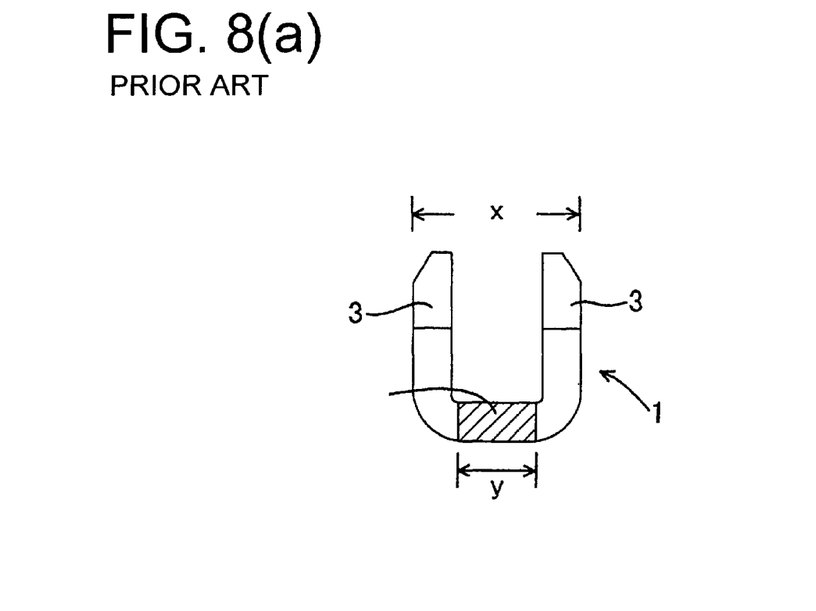
FIG. 8 is an explanatory view showing a terminal fitting in which a contact blade is extended from a side edge of a base plate.
Figure 8B:
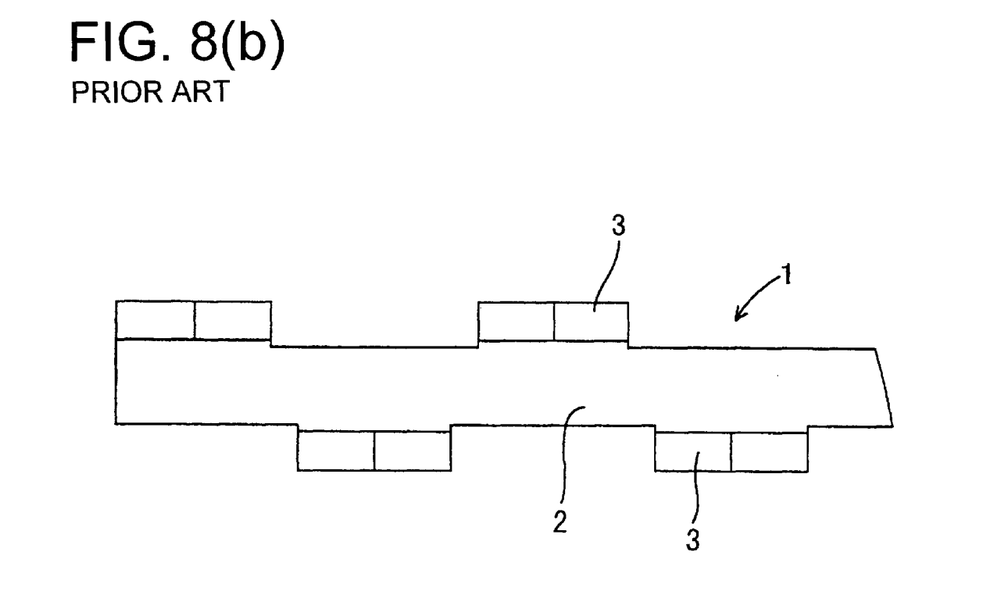
Figure 9A:
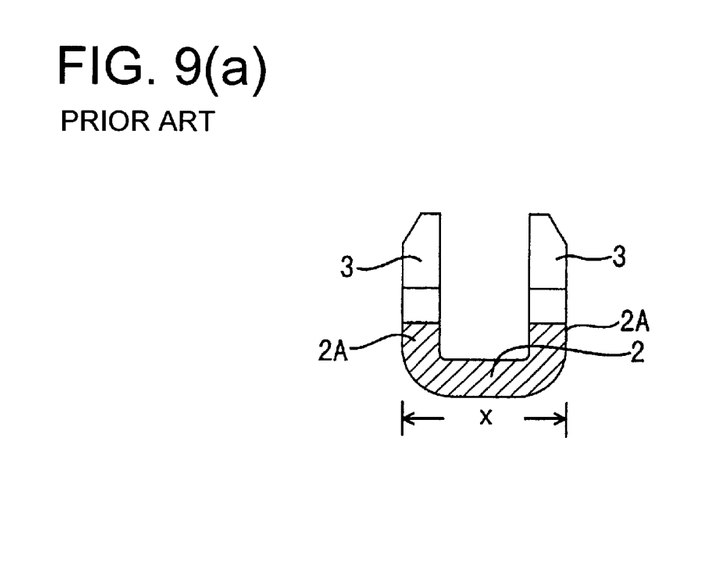
FIG. 9 is an explanatory view showing a terminal fitting in which a contact blade is provided in flush with a side wall of a base plate.
Figure 9B:
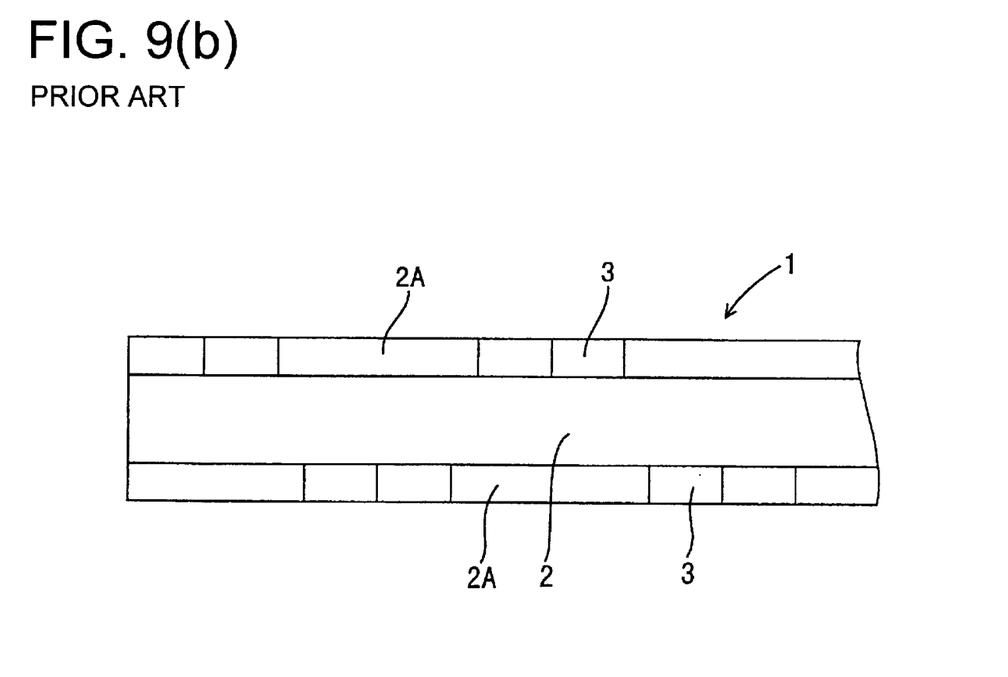

As shown in FIG. 8, the contact blades 3 project outward from the side edges of the base plate 2. The space between the left and right contact blades 3 must be small if the conductive path 5 is narrow. In this situation, the width y of the base plate 2 must be very narrow, as shown in FIG. 8A. Thus, the base plate 2 has a low degree of strength. To improve the strength of the base plate 2 without changing the interval between the left and right contact blades 3, it is absolutely necessary to make a channel-type base plate having a side wall erected on both sides of the base plate to secure a large width x. The contact blades 3 then are erected on the upper edge of side wall 2A such that the contact blades are flush with the side wall 2A, as shown in FIG. 9.

Figure 10:
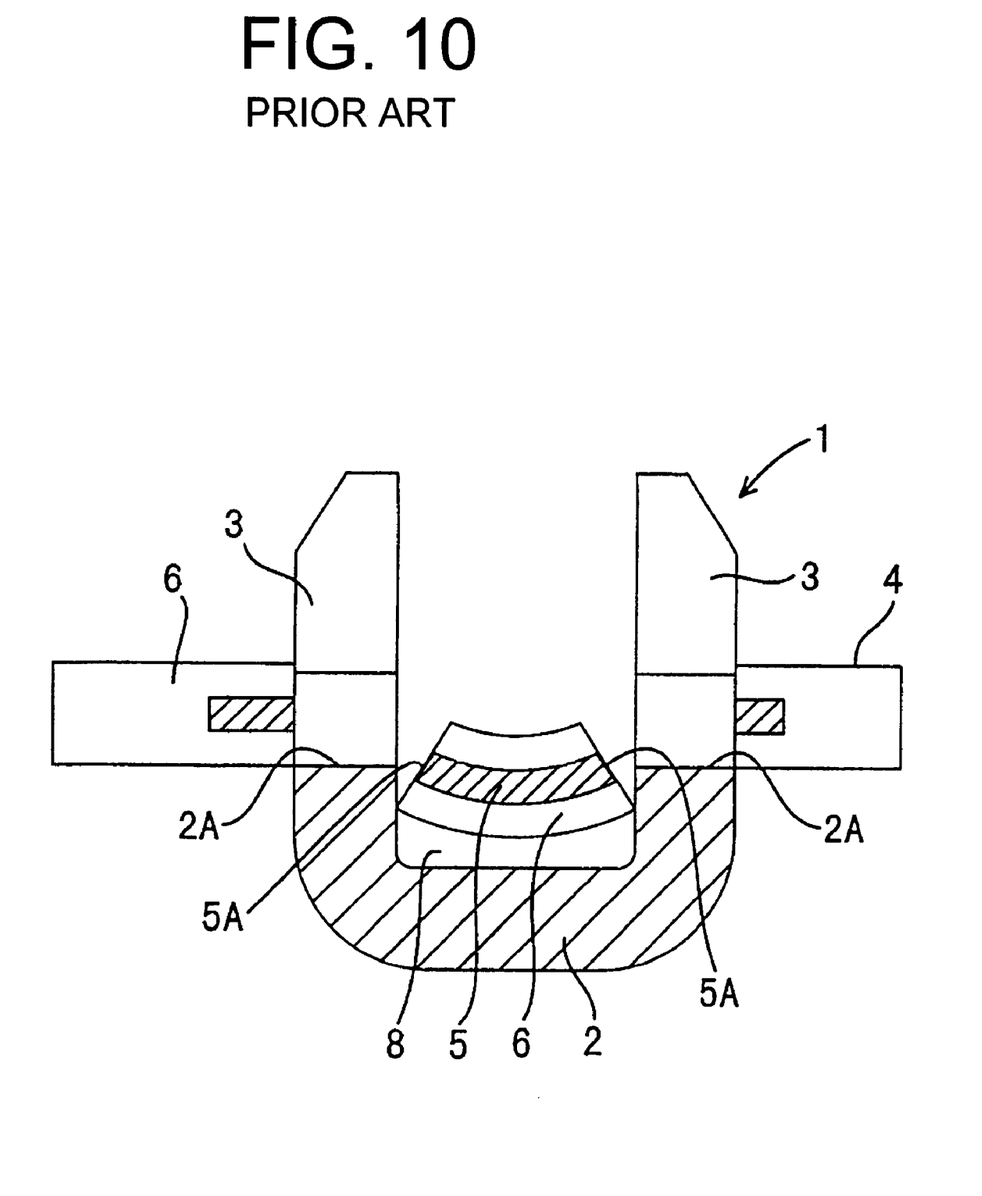
FIG. 10 is a sectional view for explaining a connection state of the terminal fitting of FIG. 9.

The construction in which the contact blades 3 are flush with the side wall 2A requires the FFC 4 to be pressed toward the base plate 2 so that the contact blades 3 pierce into the conductive path 5. However, as shown in FIG. 10, this design causes the upper edge of the side wall 2A to catch the FFC 4. As a result, the FFC 4 cannot be pressed to the bottom of the base plate 2. That is, a flank 8 is formed between the FFC 4 and the bottom of the base plate 2. As a result, the FFC 4 flexes and escapes to the flank 8. In this case, a sufficient contact pressure may not be obtained between a cut surface 5A of the conductive path 5 and the contact blades 3 or only a part of an insulation sheet 6 is in contact with the surface of the side wall 2A of the contact blade 2. Thus, there is a possibility that the connection method is not reliable in electrical contact.

The present invention has been completed in view of the above-described situation. Thus, it is an object of the present invention to allow a reliable contact between a contact blade of a terminal fitting of through type and a cut surface of a conductive path of a flat conductor.

SUMMARY OF THE INVENTION

The subject invention is directed to a terminal fitting connected to a flat conductor whose conductive path is embedded in an insulation layer. The terminal fitting comprises a base plate and a pressing plate that confronts the base plate. A side wall is erected on a side edge of the base plate, and a contact blade projects from an upper edge of the side wall, such that the contact blade is flush with the side wall in a widthwise direction. The contact blade is pierced into the conductive path, with the flat conductor being sandwiched between the base plate and the pressing plate to connect the terminal fitting to the terminal of the flat conductor. A raised part or support is erected on a bottom portion of the base plate such that a height of the support is equal to or slightly larger than that of an upper edge of the side wall. Preferably, the support is formed integrally with the base plate.

The contact blades are pierced into the conductive path, with the flat conductor being sandwiched between the support and the pressing plate, before the flat conductor is caught by the upper edge of the side wall of the base plate. That is, it is possible to avoid generation of a flank between the base plate and the pressing plate and the flat conductor is prevented from escaping into such a flank. Thus, it is possible to allow the cut surface of the conductive path to confront the surfaces of the contact blades properly and to obtain an optimal contact state. Thus it is possible to obtain a stable electrical performance.

It is possible to reduce the number of parts and hence convenient to handle the terminal fitting in the connection operation.

DETAILED DESCRIPTION OF THE PREFERRED EMBODIMENTS

Figure 1:
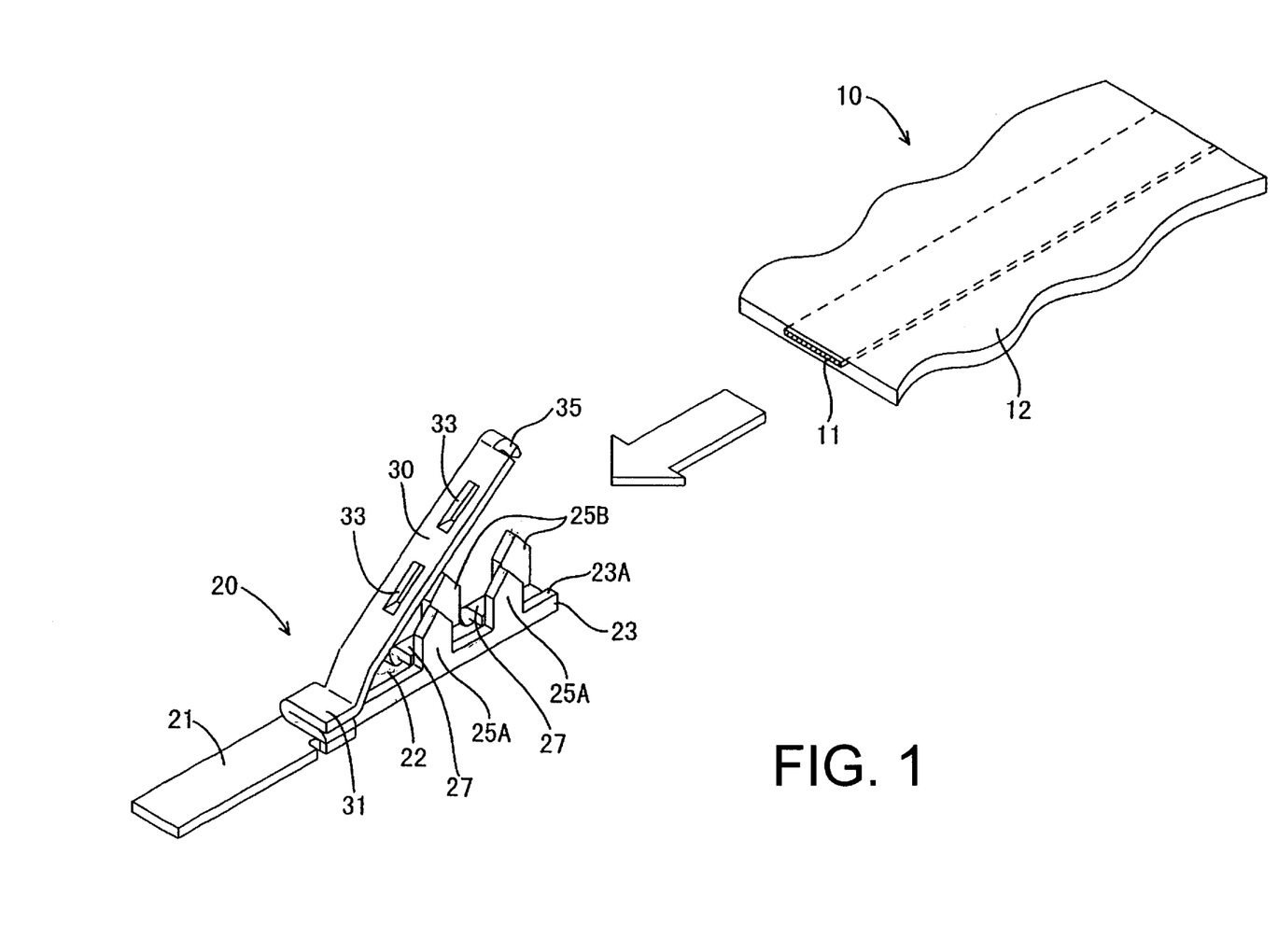
FIG. 1 is a perspective view showing a terminal fitting of an embodiment of the present invention and an FFC not connected thereto.

An FFC (flexible flat cable) is identified generally by the numeral 10 in FIG. 1. The FFC 10 is shown as an example of a flat conductor that is ribbon-shaped as a whole. Conductive paths 11 are arranged in parallel with one another at predetermined intervals in the FFC 10, and are embedded in insulation sheets 12 that are disposed on upper and lower surfaces of the conductive paths 11.

The terminal fitting is connected to a disposing position of each conductive path 11 of the FFC 10.

Figure 2:
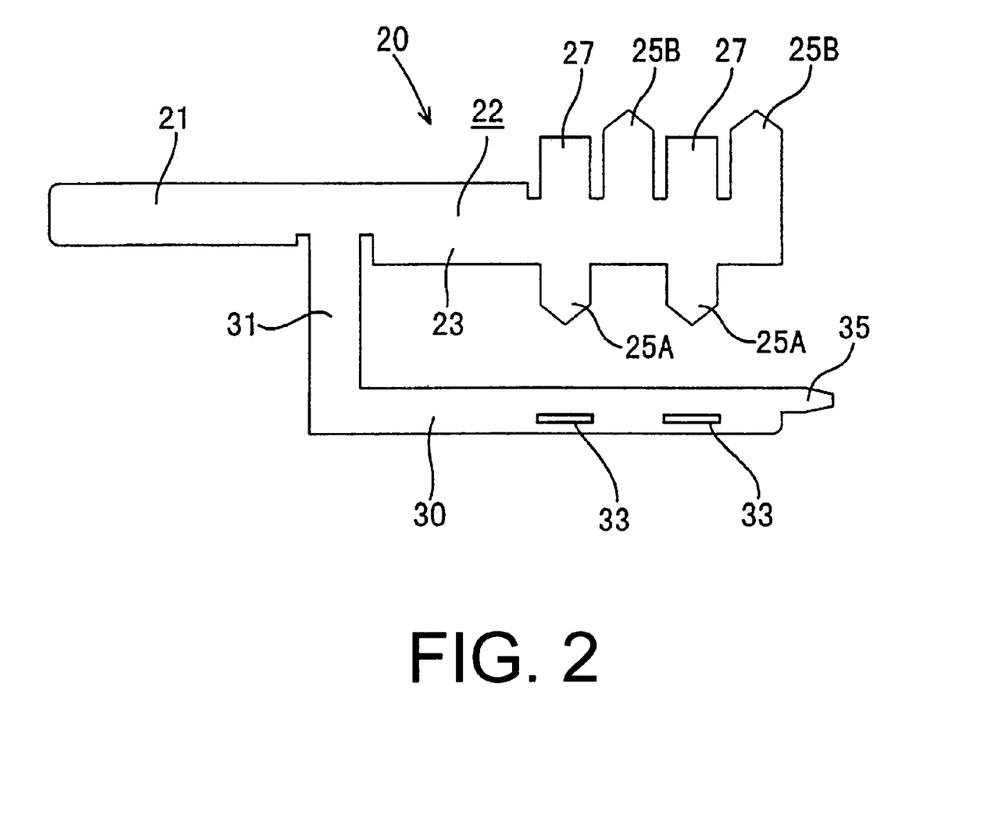
FIG. 2 is a top plan view of a metal blank for forming the terminal fitting of FIG. 1.
Figure 3:
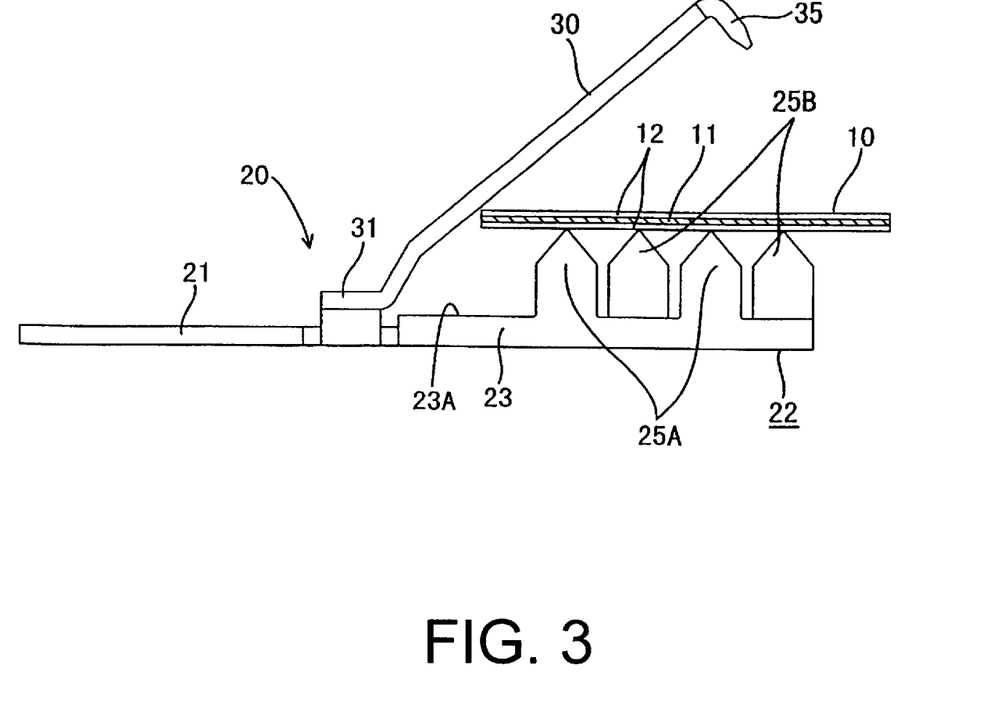
FIG. 3 is a partly cutout side view showing the terminal fitting and the FFC not connected thereto.

A terminal fitting 20 of the first embodiment is formed as a male terminal fitting by press-molding a metal plate that is highly electrically conductive. As shown in FIGS. 1–3, the terminal fitting 20 includes a tab 21 with a rear end and an opposed front end that can be fitted on a mating female terminal fitting. A base plate 22 is extended rearward from the rear end of the tab 21. A pressing plate 30, which will be described later, confronts the base plate 22 vertically.

Figure 5:
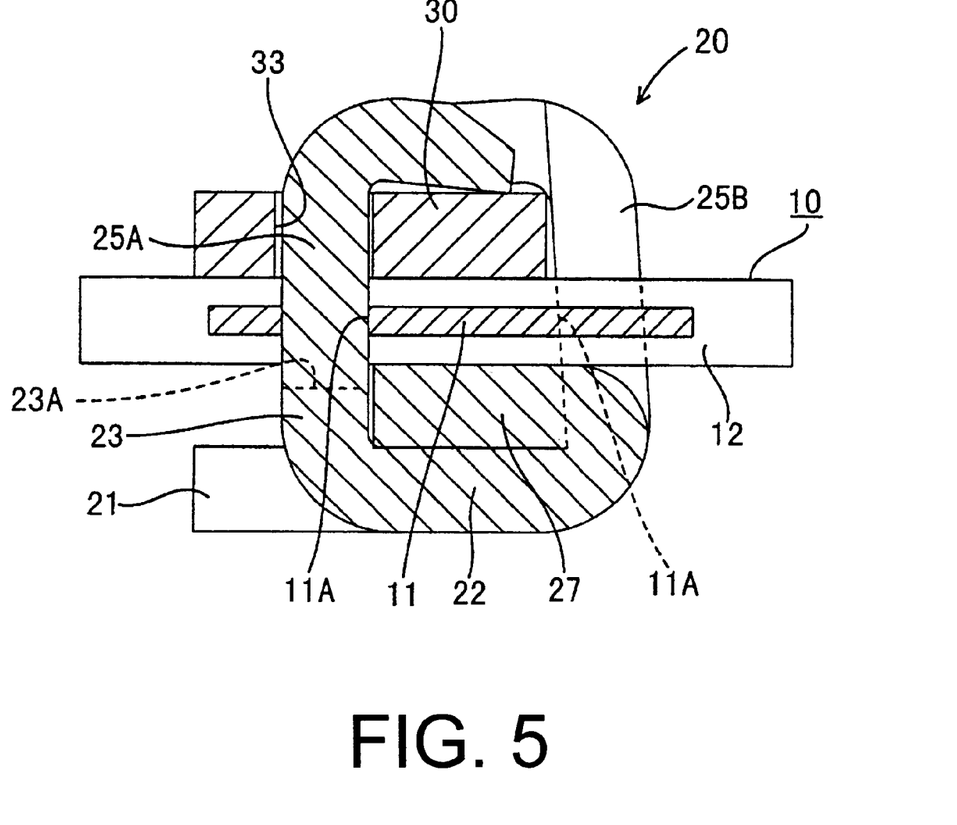
FIG. 5 is an enlarged sectional view taken along a line X—X of FIG. 4.

The base plate 22 has a width that is slightly smaller than the tab 21. Additionally, the base plate 22 is disposed to the right when it is viewed from the rear of the base plate 22. As shown in FIG. 5, a side wall 23 having a predetermined height is erected on a left side edge of the base plate 22 when the base plate 22 is viewed from the rear.

Two contact blades 25A are formed on the left side edge of the base plate 22 and two contact blades 25B are formed on the right side edge of the base plate 22, such that the contact blades 25A and 25B confront each other. More specifically, the contact blades 25A at the left side edge in a rear view are erected on an upper edge 23A of the side wall 23 such that the contact blades 25A are flush with the side wall 23 in a widthwise direction. As shown in FIG. 3, the right contact blade 25B is erected directly on the right side edge of the base plate 22 and extend as high as the left contact blade 25A. The interval between the left contact blades 25A and the right contact blades 25B is set a little smaller than the width of the conductive path 11. All of the contact blades 25A and 25B are formed with sharp upper ends.

Two raised parts or supports 27 are formed integrally on the bottom portion of the base plate 22. As shown in FIG. 2, in a developed state, each support 27 is formed on the portion of the blank that will form the base plate 22, and projects from the right side edge as viewed from the rear. Each support 27 is folded downward and into close contact with the upper surface of the base plate 22. The supports 27 project from positions on the right side edge of the base plate 22 that correspond to the respective left contact blades 25A. Each support 27 has a width equal to that of the opposed contact blade 25A. The height of the upper surface of each folded support 27 is equal to or slightly larger than that the height of the upper edge 23A of the left side wall 23 (see FIG. 5).

As shown in FIG. 2, the blank is formed such that the pressing plate 30 is parallel with the base plate 22 and is joined unitarily with the base plate 22 by a bending part 31 that projects sideways from a base portion of the tab 21. The bending part 31 is bent into close contact with one side edge of the tab 21 such that the pressing plate 30 confronts the base plate 22. The front end of the pressing plate 30 is integral or unitary with the base plate 22 such that the rear end of the pressing plate 30 can be toward and away from the base plate into opened and closed positions.

The width of the pressing plate 30 is set such that the right-side edge thereof in a rear view is located immediately inward from the right contact blades 25B and such that the left-side edge thereof is located leftward from the left contact blades 25A. Therefore, the pressing plate 30 has slit-shaped insertion holes 33 in the vicinity of the left side edge thereof in a rear view. The left contact blades 25A can be inserted into the respective insertion holes 33.

A piercing piece 35 that can be inserted into the FFC 10 is formed at the rear end of the pressing plate 30 and extends across about half of the entire width of the rear end of the pressing plate 30. The lower end of the piercing piece 35 is tapered to a point that is directed downward and perpendicular to the pressing plate 30 and the base plate 22.

The procedure of connecting the terminal fitting to the FFC in the embodiment is described below.

As shown in FIG. 1, the pressing plate 30 of the terminal fitting 20 initially is opened upward. Then, as shown in FIG. 3, the terminal of the FFC 10 is placed on the left and right contact blades 25 by adjusting the mating position of the conductive path 11 to the location of the terminal fitting 20. The pressing plate 30 then is pivoted to its closed position. As a result, the FFC 10 is pressed toward the base plate 22, and the left and right contact blades 25 of the base plate 22 are pierced into the lower surface of the terminal of the FFC 10. More specifically, as shown in FIG. 5, the left contact blade 25A is pierced into a position located slightly inward from the left side edge of the conductive path 11 and then projects from the upper surface of the pressing plate 30 through the insertion hole 33 thereof. At this time, the right contact blade 25B is pierced into a position slightly inward from the right side edge of the conductive path 11 and projects from the upper surface of the conductive path 11.

Figure 4:
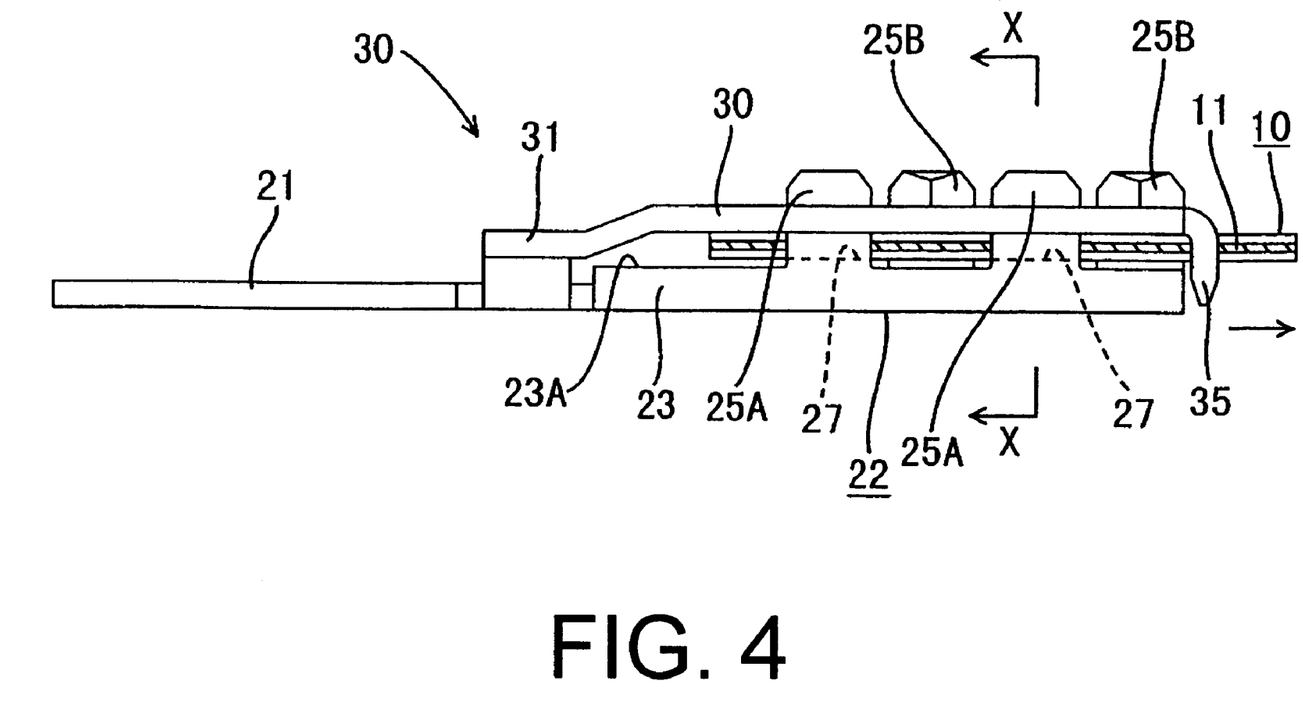
FIG. 4 is a partly cutout side view showing the terminal fitting and the FFC not connected thereto.
Figure 6:
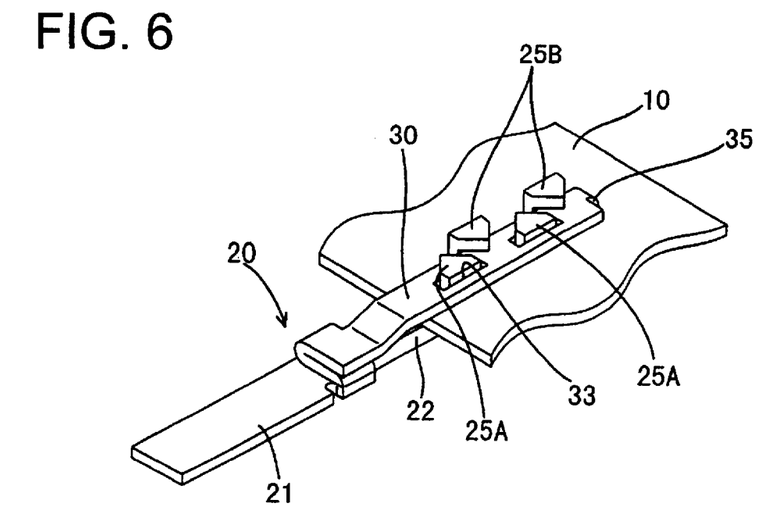
FIG. 6 is a perspective view showing the terminal fitting and the FFC connected thereto.

The pressing of the FFC 10 by the pressing plate 30 ends when the pressing plate 30 urges the FFC 10 into contact with the support 27 formed on the bottom portion of the base plate 22. When the pressing operation stops, the projected end of each of the contact blades 25A and 25B is bent inward and crimped to the upper surface of the pressing plate 30. Consequently, as shown in FIGS. 4 through 6, the terminal fitting 20 is connected to the FFC 10, with the pressing plate 30 and the base plate 22 placed in the closed state.

The piercing piece 35 formed at the rear end of the pressing plate 30 pierces the disposing position of the conductive path 11 of the FFC 10 and projects from the lower surface of the FFC 10.

As described above, the support 27 that projects upward from the upper edge 23A of the side wall 23 is formed on the bottom portion of the base plate 22. Thus, when the FFC 10 is pressed with the pressing plate 30, the contact blades 25A and 25B pierce into the conductive path 11, and the FFC 10 is sandwiched between the supports 27 and the pressing plate 30. This piercing of the conductive path 11 and the sandwiching of the FFC 10 occurs before the FFC 10 is caught by the upper edge 23A of the side wall 23 of the base plate 22. Thus, as shown in FIG. 5, it is possible to avoid generation of a flank between the base plate 22 and the pressing plate 30 and thus it is possible to prevent the FFC from escaping into the flank. Thus, it is possible to allow the cut surface 11A of the conductive path 11 to confront the surfaces of the contact blades 25A and 25B properly and to obtain a preferable contact state. Thereby it is possible to obtain a stable electrical performance.

The FFC 10 is used with the terminal fitting 20 connected with the terminal of the FFC 10 and accommodated in a cavity of a connector housing (not shown). A tensile force may be applied to the FFC 10 in a rearward direction or to the right in FIG. 4. But the piercing piece 35 formed at the rear end of the pressing plate 30 pierces the FFC 10 in a direction perpendicular to the direction of the applied tensile force, thus hooking the terminal fitting 20 firmly in resistance to the tensile force. Therefore, the terminal fitting 20 is not easily removed from the FFC 10.

Further, because the piercing piece 35 pierces the conductive path 11, it is possible to increase the contact area between the terminal fitting 20 and the conductive path 11.

The present invention is not limited to the embodiment described above with reference to the drawings. For example, the following embodiments are included in the technical scope of the present invention. Further, various modifications can be made without departing from the spirit and scope of the present invention.

The raised part or support may be a bead formed on the bottom portion of the base plate or formed by fixing a separate material to the bottom portion.

The ceiling plate may be separate from the bottom plate.

The method of connecting the terminal fitting to the FFC may be performed by turning the base plate and the pressing plate upside down. Additionally, it is possible to form the contact blades on the ceiling plate and the bottom plate may function as the pressing plate.

It is possible to penetrate the contact blade at one side edge of the base plate into the conductive path and to crimp the contact blade at the other side thereof to the pressing plate.

The present invention also can be used to connect the female terminal fitting to the FFC.

It is also possible to apply the present invention to other flat conductors, such as an FPC in which the conductive path is covered with the insulation layer.

What is claimed is:

1. A terminal fitting connected to a terminal of a flat conductor (10), the flat conductor (10) having a conductive path (11) embedded in an insulation layer (12), comprising:

a base plate (22);

a pressing plate (30) confronting said base plate (22);

a side wall (23) erected on a side edge of said base plate (22); and at least one contact blade (25A) projected on an upper edge (23A) of said side wall (23), such that said contact blade (25A) is widthwise flush with said side wall (23), wherein said contact blade (25) is pierced into said conductive path (11), with said flat conductor (10) being sandwiched between said base plate (22) and said pressing plate (30) to connect said terminal fitting to said terminal of said flat conductor (10); and a support (27) erected on a bottom portion of said base plate (22) such that a height of said support (27) is at least equal to a height of the upper edge (23A) of said side wall (23).

2. A terminal fitting according to claim 1, wherein said support (27) is formed integrally with said base plate (22).

3. A terminal fitting for a flat conductor (10), said terminal fitting comprising:

an elongate base plate (22) having opposed front and rear ends, opposed first and second longitudinal sides extending between said front and rear ends, a top surface and a bottom surface, a side wall (23) extending upwardly from said first longitudinal side of said base plate (22), at least one first contact blade (25A) extending upwardly from said side wall (23), said first contact blade (25A), having an upper end disposed above the upper surface of the base plate (22) by a selected distance, a support (27) extending unitarily from the second longitudinal side of the base plate (22) and being folded substantially into face-to-face contact with the upper surface of the base plate (22), at least one second contact blade (25B) projecting unitarily upwardly from the second side edge of the base plate (22) at a location spaced from the support (27), the second contact blade (25b) having an upper end spaced from the upper surface of the base plate (22) by the selected distance; and an elongate pressing plate (30) having a front end pivotally connected in proximity to the front end of the base plate (22), the pressing plate (30) further having a rear end selectively movable toward and away from the rear end of the base plate (22) in response to pivoting of the pressing plate (30).

4. The terminal fitting of claim 3, wherein the side wall (23) includes an upper edge spaced above the upper surface of the base plate (22) by a selected height, the support (27) having a supporting surface facing upwardly and away from the base plate (22) and being spaced above the base plate (22) by a distance at least as great as the height of the upper edge of the side wall (23).

5. The terminal fitting of claim 4, wherein the at least one first contact blade (25A) comprises two spaced-apart first contact blades (25A), and wherein the at least one second contact blade (25B) comprises two spaced-apart second contact blades (25B), the first and second contact blades (25A, 25B) being offset longitudinally from one another.

6. The terminal fitting of claim 5, wherein the at least one support plate (27) comprises two supports (27), the supports (27) being aligned respectively with the two first contact blades (25A).

7. The terminal fitting of claim 3, wherein the base plate (22) is substantially planar, the side wall (23) and the first contact blade (25) defining a plane aligned substantially perpendicular to the base plate (22), the second contact blade (25B) defining a plane aligned substantially parallel to the plane defined by the side wall (23) and the first contact blade (25A).

8. The terminal fitting of claim 3, wherein the pressing plate (30) includes at least one slot dimensioned for receiving at least the first contact blade (25A) as the pressing plate (30) is rotated toward the base plate (22).

9. The terminal fitting of claim 3, wherein the terminal fitting is unitarily formed from a single plate of conductive metal.

* * * * *